United States Patent [19]
Rackley

[11] Patent Number: 5,365,122
[45] Date of Patent: Nov. 15, 1994

[54] META STABLE RESISTANT SIGNAL DETECTOR

[75] Inventor: David T. Rackley, Garland, Tex.

[73] Assignee: VLSI Technology, Inc., San Jose, Calif.

[21] Appl. No.: 989,492

[22] Filed: Dec. 10, 1992

Related U.S. Application Data

[63] Continuation of Ser. No. 611,224, Nov. 9, 1990, abandoned.

[51] Int. Cl.⁵ .............................................. H03K 5/153
[52] U.S. Cl. .................................... 327/306; 327/198; 326/21; 326/94
[58] Field of Search ............... 307/480, 481, 269, 443, 307/272.1, 272.2, 350

[56] References Cited

U.S. PATENT DOCUMENTS

| | | | |
|---|---|---|---|
| 4,575,644 | 3/1986 | Leslie | 307/272.1 |
| 4,849,653 | 7/1989 | Imai et al. | 307/272.1 |
| 4,851,710 | 7/1989 | Grivna | 307/480 |
| 4,929,850 | 5/1990 | Breuninger | 307/480 |
| 4,939,394 | 7/1990 | Hashimoto | 307/480 |
| 4,963,772 | 10/1990 | Dike | 307/480 |
| 4,982,118 | 1/1991 | Lloyd | 307/480 |
| 5,001,371 | 3/1991 | Mahabadi | 307/480 |

OTHER PUBLICATIONS

"VLSI Engineering," by Thomas E. Dillinger, *Library of Congress Cataloging-in-Publication*, 1988, pp. 503–504.

"H4C Series CMOS Gate Arrays Design Reference Guide", by Ruth Massey et al, *Motorola, Inc.*, 1992, p. 7.

*Primary Examiner*—Timothy P. Callahan
*Attorney, Agent, or Firm*—Burns, Doane, Swecker & Mathis

[57] ABSTRACT

The present invention relates to a signal detector capable of accurately and reliably interpreting different logic states of an asynchronous signal of unpredictable pulse width or amplitude. In one embodiment of the invention, a meta-stable resistant set-reset (RS) flip-flop is described which can be designed from standard library components suitable for implementation in a cell-based or gate array integrated circuit.

24 Claims, 1 Drawing Sheet

META STABLE RESISTANT SIGNAL DETECTOR

This application is a continuation of application Ser. No. 07/611,224, filed Nov. 9, 1990, now abandoned.

BACKGROUND OF THE INVENTION

1. Field of the Invention

The present invention generally relates to the design of circuit components and more particularly, to the design of circuit components for accurately detecting asynchronous input signals in, for example, application specific integrated circuits (ASICs).

2. State of the Art

The use of asynchronous signals in electronic circuits and systems such as ASICs imposes signal detection considerations which must be taken into account to ensure proper circuit operation. Foremost among these considerations is the accurate detection of the asynchronous signal which, by definition, may occur at any point in time. Asynchronous signals occur when, for example, signals are transferred between circuits operating at different clock rates. These signals cannot be easily detected by strobing a given input at a predetermined time.

Further, the difficulty in detecting asynchronous signals is further enhanced by the unpredictable characteristics of the signal itself. For example, an asynchronous digital signal should have a sufficient pulse width to permit its ready detection. The pulse width of the signal represents the length of time during which a given logic level of the signal is available for detection. However, glitches in the signal can prevent signal detection circuitry from sensing the logic level of the signal for a long enough period of time to permit detection.

For example, a digital signal can be generated using an opaque disk with a light emitter and a light sensor. The opaque disk includes slits which permit light to pass through the disk from the emitter to the sensor. Light detected by the sensor is used to form pulses which represent an asynchronous signal. However, this form of digital generation is especially susceptible to the presence of glitches which prevent accurate signal detection.

Presently, circuits are known for detecting the logic state of asynchronous digital signals having unpredictable pulse widths. One such circuit is a common "D flip-flop" as shown in FIG. 1(a). An asynchronous signal to be detected is directed to the clock input 2 of the flip-flop, while a digital logic level to be detected is directed to the D input 4. The detected signal is then produced on the Q output line 6, after which the flip-flop is cleared via a reset line 8.

Another common circuit is a "set-reset latch" as shown in FIG. 1(b), wherein two NAND gates 10 and 12 are shown. Outputs of the two NAND gates are cross connected to a respective input of the opposite NAND gate. NAND gate 10 thus receives the output of NAND gate 12 and a reset signal as inputs. NAND gate 12 receives the output of NAND gate 10 and the asynchronous input signal as inputs.

In operation, an active low input signal is detected as follows. Initially, after a reset of the output of NAND gate 10 to an inactive high logic level, the reset line is held high. At this time the output of NAND gate 12 is low since the input signal is also in its inactive high logic state. The output of NAND gate 10 is therefore high since the reset input is high and the output of NAND gate 12 is low. When the asynchronous input signal goes low, the inputs of NAND gate 12 are no longer both high such that the output of NAND gate 12 is driven high. When the output of NAND gate 12 goes high, both inputs of NAND gate 10 are high such that the output of NAND gate 10 is driven low.

A significant drawback of known signal detector designs such as those described above are their susceptibility to meta-stability. Meta-stability, as referred to herein, is the grey region which exists between a range of voltage values used to represent a logic low and a range of voltage values used to represent a logic high. If, for example, the pulse width and/or amplitude of an input signal is not of adequate duration or magnitude to permit the FIG. 1(b) circuitry to detect a logic level shift, then the FIG. 1(b) circuitry can, and often does, provide an output which floats in a meta-stable range of values. These meta-stable values are subsequently detected and interpreted as different logic level states by different circuits connected to the output and can cause significant circuit problems.

Accordingly, there is a need for a signal detector which is not susceptible to meta-stability and which provides accurate, reliable detection of logic level states associated with asynchronous signals of unpredictable pulse widths and amplitudes.

SUMMARY OF THE INVENTION

The present invention relates to a signal detector capable of accurately and reliably interpreting different logic states of an asynchronous signal of unpredictable pulse width and amplitude. In one embodiment of the invention, a meta-stable resistant set-reset (RS) flip-flop is described which can be designed from standard library components suitable for implementation in a cell-based or gate array integrated circuit.

BRIEF DESCRIPTION OF THE DRAWINGS

The present invention can be further understood by reference to the following description and the appended drawings which illustrate the invention. For purposes of description, identical components are given the same reference numerals in various drawing figures. In the drawings.

DETAILED DESCRIPTION OF PREFERRED EMBODIMENTS

Figure 1A:
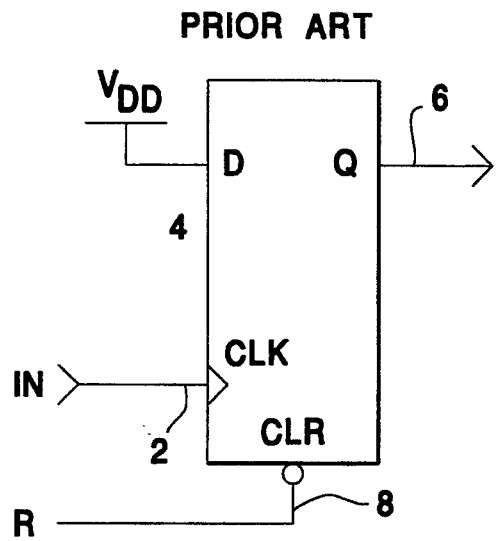
FIGS. 1(a) and 1(b) show a common D flip-flop and typical latch circuitry for detecting asynchronous input signals.
Figure 1B:
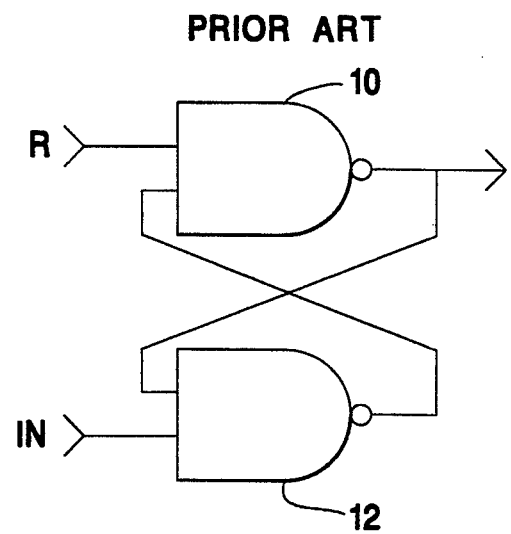
Figure 2:
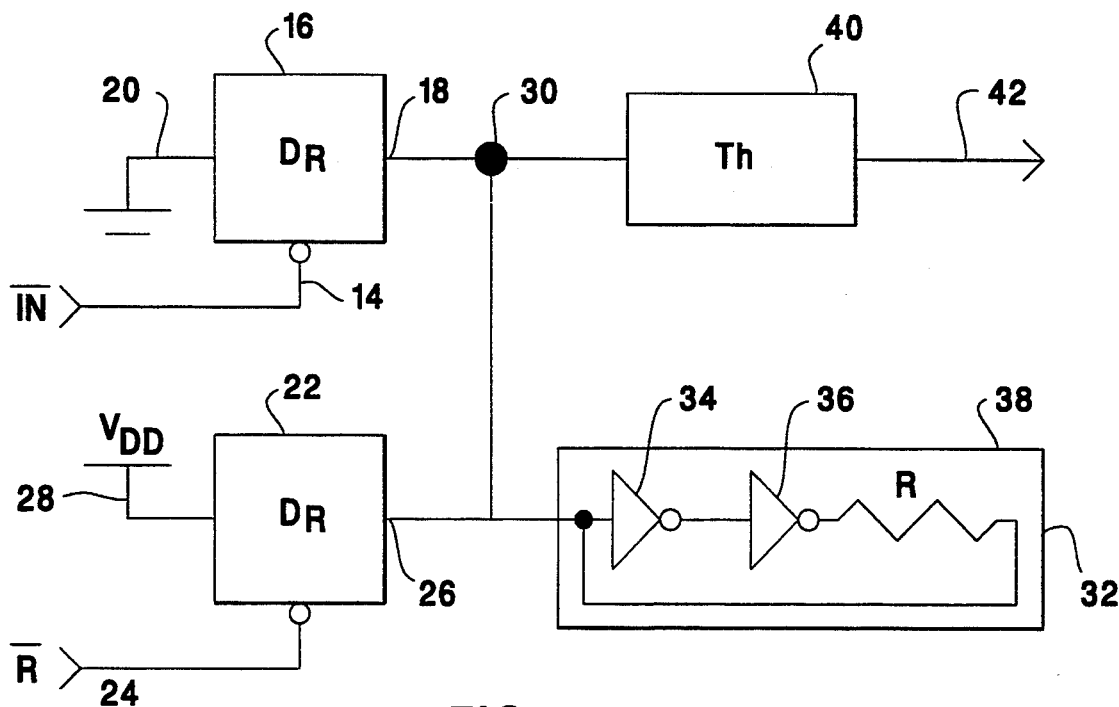
FIG. 2 shows an exemplary embodiment of a meta-stable resistant RS flip-flop.

By way of example, FIG. 2 shows a preferred embodiment of implementing a meta-stable resistant RS flip-flop for detecting asynchronous signals of unpredictable pulse width. It will be appreciated that the FIG. 2 circuit can, if desired, also be used for detecting synchronous signals and/or signals having logic states represented by predetermined pulse widths. In the exemplary embodiment of FIG. 2, $V_{DD}$ is 5 volts and ground is zero volts. For these values, a pulse width of 1 ns or less is typically adequate to enable detection of a logic state.

In FIG. 2, an input signal is received at input 14 to a first signal driver 16. The driver 16 includes an output 18 and a second input 20. Upon the presence of an active input signal at input 14, the output 18 is driven to a logic state represented by the voltage value present at the second input 20. The driver 16 can, of course, be driven to the logic level associated with input 20 in response to either an active low or an active high input signal, with the active state of the input signal being determined in advance by the circuit designer.

A second signal driver 22 is provided and receives a first reset input 24. The second driver 22 includes an output 26 and a second input 28. As with the first driver 16, the output of the second driver 22 is driven to the logic state represented by the voltage value present at the second input 28 upon the presence of an active low reset signal. Again the circuit designer can select a reset signal which is either active low or active high.

In a preferred embodiment, each of the signal drivers are simply single transistors. For example, the signal driver 16 can be an n-type transistor while the signal driver 22 can be a p-type transistor (where input 14 is active high and input 24 is active low). More generally, the signal drivers 16 and 26 can be any circuit component or components capable of providing at least one hard driven logic level output state (e.g., high or low), and an inactive, high impedance output state.

Accordingly, the signal drivers 16 and 22 can be any known three-state buffer, wherein "three-state" refers to the ability to produce a high impedance output state. Preferably, three-state buffers are selected to impose relatively short pulse width requirements on an input signal to be detected and to provide relatively sharp slopes for an output signal produced in response to a detected input signal. Of course, the logic level state detected by the FIG. 2 circuit can be easily reversed by reversing the voltage levels present at the inputs 20 and 28 of the drivers 16 and 22, respectively.

For example, a typical three-state buffer includes two serially connected p-type transistors with two serially connected n-type transistors to provide a-string of four transistors connected via their drain and source terminals. The open drain of the first p-type transistor is, for example, connected with a voltage level representing a logic level high. The open source of the second n-type transistor is then connected with a voltage level corresponding to a logic level low. The gate of the intermediate p and n-type transistors receives the input signal, and the junction between the source and drain terminals, respectively of the intermediate p and n-type transistors serves as the output. The gates of the first p-type transistor and the second n-type transistor are tied to a voltage value representing the logic level to which the buffer is to be driven during an active state.

The output 26 of the second driver 22 is connected via a node 30 to the output of the first driver 16 and to a bus repeater 32. A bus repeater is a known storage device which typically includes two serially connected invertor circuits and a resistor. As shown in FIG. 2, the bus repeater 32 includes a first inverter circuit 34 whose input is connected to node 30 and whose output is connected to the input of a second inverter circuit 36. The output of the second inverter 36 is connected to one end of a resistor 38, whose other end is connected to the input of the first inverter circuit 34.

A known bus repeater such as that shown in FIG. 2 can be constructed as a standard gate array component. In operation, an input which rises above or falls below a given threshold of the bus repeater is detected as a logic level high or low, respectively. This signal is then inverted to the opposite logic level state (i.e., logic level low or high) by the first inverter circuit 34. The output of the first inverter circuit is then again inverted to the originally detected logic level state by the second inverter circuit 36 and held, or stored, at that level.

Where a logic level high is represented by a voltage value of approximately 5 volts, a typical threshold for the first inverter circuit 34 of the bus repeater would be a voltage level of approximately 2.5 volts. However, any suitable threshold can be selected. For example, a threshold of approximately 3.75 volts can also be used. Accordingly, even if the voltage level present at node 30 is in a meta-stable range of 1 to 4 volts in the above example, a high or low logic level would be positively established and latched using a feedback path established by the bus repeater. The bus repeater will then latch node 30 at this output state using the serially connected inverter circuits to drive node 30 to a valid logic level.

The FIG. 2 circuit also includes a threshold level shifter 40 connected to the node 30. A level shifter is a known device which interfaces logic level states of given voltage levels to logic level states of different voltage levels. For example, when interfacing TTL signals to CMOS, the level shifter provides a signal detection threshold appropriate to TTL voltage operating conditions. Its outputs will then be appropriate for CMOS voltage operating conditions.

Generally speaking, the level shifter 40 can be any known voltage level shifter having logic states represented by a range of voltage values which is less than or greater to that associated with the bus repeater 32. This requirement ensures that any meta-stable input signals not yet driven to valid logic levels by the bus repeater will be accurately produced at an output 42 of the FIG. 2 circuit.

More particularly, the threshold of the level shifter ensures that when the voltage level at node 30 is in the grey area of the bus repeater, the detected signal at output 42 will not toggle. For this purpose, the voltage level threshold of the level shifter is below or above the threshold, or trip point of the bus repeater. For example, if a trip point of 2.5 volts is associated with the bus repeater, then an appropriate range of values for the level shifter would be 0 volt to 2.4 volts (i.e., a standard TTL level shifter, with 0 volts representing a logic low and 2.5 volts representing a logic high such that a threshold of approximately 1.4 volts is typically used by the level shifter to distinguish these two logic states).

Further, the signal driver circuits 16 and 22 should be very fast and strong (i.e., high drive current devices) relative to the bus repeater and level shifter circuits. That is, the drivers must be of sufficient strength to overdrive the bus repeater during a change in logic state.

Operation of the FIG. 2 circuit will now be described for an active low input signal detection of an asynchronous, variable width-pulse with a level shifter threshold set below that of the bus repeater. Basically, three signal detection conditions will be described. A first condition is represented by rejection of the input signal, a second condition is represented by detection of the input signal, and a third is represented by detection of a marginal input signal.

Initially, because the FIG. 2 circuit is active low, a reset signal is used to drive the detected signal to a high logic level. Subsequently, in accordance with the first condition, when a low input pulse is received at the input 14, the width and/or amplitude of the pulse is insufficient to bring the voltage at node 30 down to the trip point of the bus repeater 32. Because the trip point of the threshold level shifter 40 is below that of the bus repeater, the output 42 of the level shifter 40 still remains at a logic level high. The bus repeater then drives the voltage at node 30 back to a logic high reset level. Thus the signal at output 42 does not change state and the input has been rejected.

In the second aforementioned condition, the input signal pulse width is sufficient to reduce the voltage at node 30 toward the trip point of the bus repeater 32. Once the trip point is reached, the bus repeater further drives the node 30 to a logic low. As the voltage at node 30 crosses below the relatively low threshold of the level shifter 40 the output 42 is driven to an active low logic level. The output 42 is then retained at a logic level low due to the active drive of the bus repeater 32.

In the third condition mentioned above, the pulse width of the input signal results in potential meta-stability. That is, a voltage is produced at node 30 which is in the grey region between voltages associated with logic levels selected for operation. However, rather than fall into a meta-stable condition, the FIG. 2 circuit resolves the voltage level present at node 30 into a logic high or a logic low level.

As described previously, if the voltage level of node 30 is driven toward a logic low for a period of time sufficient to cross the trip point of the bus repeater, then the bus repeater will store the logic level and hard drive the voltage at node 30 to a logic low. Once the bus repeater has driven the voltage at node 30 below the threshold of the level shifter 40, an active low signal is detected and produced at output 42. Afterwards, a reset signal must be supplied to the reset line 24 to return the output 42 to a logic level high. If, however, the trip point of the bus repeater is not crossed, the output 42 returns to a logic level high indicating rejection of the input signal.

The foregoing description of preferred embodiments has discussed meta-stable resistant RS flip-flops which can be composed of standard gate array components suitable for implementation in a gate array. For example, three-state buffers which possess low pulse width requirements and which provide sharp pulse edge transitions relative to a typical bus repeater circuit and TTL level shifter are often configured as standard library cells readily available for implementation in a cell-based or gate array ASIC. Similarly, the aforementioned TTL level shifter and bus repeater 32 are readily available standard cells. A known TTL level shifter includes, for example, p and n-type transistors arranged to provide standard TTL logic level outputs ranging from approximately 0 to 2.4 volts as described previously.

However, the invention is not limited to the use of such standard cells, but can be implemented by any known circuit components having the respective characteristics described above. The invention is also applicable to signal detectors configured as latching devices other than RS flip-flops. For example, the dual threshold feature as described with respect to FIG. 2 can be employed in any latching device including such devices as D flip-flops. Further, the invention is not limited to ASICs, but can be implemented in any circuit where synchronous or asynchronous detection of an input pulse signal is desired.

As mentioned previously, voltage values for logic high and low levels will vary with design and can also be set to any desired values provided appropriate thresholds are selected for the bus repeater and the level shifter. Although the threshold levels selected for the bus repeater and the level shifter should be different, they should be chosen to provide robust performance of the circuits with which the detector will be used; i.e., be selected relative to voltage values associated with high and low logic levels.

The foregoing has described the principles preferred embodiments and modes of operation of the present invention. However, the present invention should not be construed as being limited to the particular embodiments discussed. Accordingly, the above-described embodiments should be regarded only as illustrative, and it should be appreciated that workers skilled in the art may make variations in those embodiments without departing from the spirit and scope of the invention as defined by the following claims.

What is claimed is:

1. A device for distinguishing logic states of an asynchronous signal comprising:
    means for receiving and driving a signal to be detected, said receiving and driving means including a three-state buffer of a first conductivity type for providing an output signal;
    means for latching said output signal of said receiving and driving means to a given logic state by comparing said output to a first threshold in a bus repeater;
    means for level shifting the latched output signal of said latching means by comparing said latched output to a second threshold; and
    means for resetting said device, said resetting means including a three-state buffer of a second conductivity type different from said first conductivity type.

2. Device according to claim 1, wherein said receiving and driving means comprises at least one transistor for providing said output signal.

3. Device according to claim 1, wherein said bus repeater includes two serially connected inverters, said serially connected inverters providing said latched output signal to said level shifting means.

4. Device according to claim 1, wherein said level shifting means is a TTL level shifter.

5. Device according to claim 1, wherein each of said receiving and driving means, said latching means, and said level shifting means is formed as a standard gate array cell.

6. Device according to claim 1, wherein said second threshold is less than said first threshold when said signal to be detected is active low.

7. Device according to claim 1, wherein said first threshold is approximately 2.5 volts and said second threshold is approximately 1.4 volts.

8. Method for distinguishing logic states of an asynchronous signal comprising the steps of:
    receiving and driving a signal to be detected by passing said signal through a three-state buffer of a first conductivity type;
    latching an output signal which has been received and driven to a given logic state by comparing said output signal to a first threshold in a bus repeater to provide a latched output signal;
    level shifting the latched output signal by comparing said latched output to a second threshold; and
    resetting said latched output signal using a three-state buffer of a second conductivity type.

9. Method according to claim 8, wherein said receiving and driving step further comprises the step of passing said signal through a transistor.

10. Method according to claim 8, wherein said latching step further comprises the step of passing said output signal through two serially connected inverters of said bus repeater before said output signal is level shifted.

11. Method according to claim 8, wherein said level shifting step further comprises the step of shifting said latched output from a TTL level to a CMOS level.

12. Method according to claim 8, wherein each of said steps of receiving and driving, latching, and level shifting further comprises the step of passing current through standard gate array cells.

13. Method according to claim 8, wherein said level shifting step further comprises comparing said latched output to a second threshold which is less than said first threshold.

14. Method according to claim 8, wherein said latching step further comprises the step of comparing said output signal to a threshold of 2.5 volts.

15. A method according to claim 8, wherein said step of level shifting further comprises the step of comparing said latched output to a threshold of 1.4 volts.

16. A method for distinguishing logic states of an input signal which is resistant to meta-stability comprising the steps of:
    receiving and driving an input signal to a given logic state via a three-state buffer of a first conductivity type and outputting a signal representing said logic state to a node;
    latching said output signal in a bus repeater when a voltage at said node drops below a first threshold voltage;
    level shifting said latched output signal when a voltage at said node drops beneath a second threshold voltage; and
    resetting said latched output signal using a three-state buffer of a second conductivity type.

17. The method of claim 16 further comprising the steps of:
    initializing said node at a high level voltage; and
    driving said node back to said high level voltage if said output signal fails to drive said node beneath said first threshold voltage.

18. A device for distinguishing logic states of an asynchronous signal comprising:
    means for receiving and driving a signal to be detected;
    means for latching an output signal of said receiving and driving means to a given logic state by comparing said output signal to a first threshold in a bus repeater, said bus repeater including two serially connected inverters for providing a latched output; and
    means for level shifting the latched output signal of said latching means by comparing said latched output to a second threshold.

19. Device according to claim 18, wherein said receiving and driving means comprises at least one transistor for providing said output signal.

20. Device according to claim 18, wherein said level shifting means is a TTL level shifter.

21. Device according to claim 18, wherein each of said receiving and driving means, said latching means, and said level shifting means is formed as a standard gate array cell.

22. Device according to claim 18, wherein said second threshold is less than said first threshold when said signal to be detected is active low.

23. Device according to claim 18, wherein said first threshold is approximately 2.5 volts and said second threshold is approximately 1.4 volts.

24. Method for distinguishing logic states of an asynchronous signal comprising the steps of:
    receiving and driving a signal to be detected;
    latching an output signal which has been received and driven to a given logic state by comparing said output signal to a first threshold using two serially connected inverters of a bus repeater to provide a latched output signal;
    inputting said latched output signal from said serially connected inverters to a level shifting means; and
    level shifting the latched output signal by comparing said latched output to a second threshold.

* * * * *